(12) United States Patent
Jang

(10) Patent No.: US 9,564,230 B2
(45) Date of Patent: Feb. 7, 2017

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Yoon Soo Jang, Chungcheongbuk-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/683,720

(22) Filed: Apr. 10, 2015

(65) Prior Publication Data
US 2015/0213902 A1    Jul. 30, 2015

Related U.S. Application Data

(62) Division of application No. 13/718,784, filed on Dec. 18, 2012, now abandoned.

(30) Foreign Application Priority Data

Aug. 24, 2012 (KR) .................. 10-2012-0093161

(51) Int. Cl.
| | | |
|---|---|---|
| G11C 11/34 | (2006.01) | |
| G11C 16/14 | (2006.01) | |
| G11C 16/04 | (2006.01) | |
| G11C 16/34 | (2006.01) | |

(52) U.S. Cl.
CPC .......... *G11C 16/14* (2013.01); *G11C 16/0483* (2013.01); *G11C 16/3445* (2013.01); *G11C 16/3459* (2013.01)

(58) Field of Classification Search
CPC . G11C 16/14; G11C 16/0483; G11C 16/3445; G11C 16/3459
USPC ............ 365/185.15, 185.18, 185.19, 185.22, 365/185.24, 185.29, 185.3
See application file for complete search history.

(56) References Cited

U.S. PATENT DOCUMENTS

| | | | | |
|---|---|---|---|---|
| 6,172,909 | B1* | 1/2001 | Haddad .............. | G11C 16/0416 |
| | | | | 365/185.19 |
| 2010/0172188 | A1* | 7/2010 | Chen .................. | G11C 16/3409 |
| | | | | 365/185.22 |
| 2011/0110161 | A1 | 5/2011 | Lee | |
| 2012/0206967 | A1 | 8/2012 | Lutze et al. | |
| 2012/0206968 | A1* | 8/2012 | Shiino ................. | G11C 11/5635 |
| | | | | 365/185.17 |
| 2014/0078829 | A1* | 3/2014 | He ........................ | G11C 16/10 |
| | | | | 365/185.19 |

* cited by examiner

*Primary Examiner* — Fernando Hidalgo
(74) *Attorney, Agent, or Firm* — William Park & Associates Ltd.

(57) ABSTRACT

A semiconductor memory device and a method of operating the same are disclosed. The semiconductor memory device includes a memory cell array configured to include memory cells, a peripheral circuit configured to perform an erase operation and a soft program operation and a control circuit configured to control the peripheral circuit so that the memory cells are programmed though a hot carrier injection HCI method when the soft program operation is performed.

12 Claims, 5 Drawing Sheets

SEMICONDUCTOR MEMORY DEVICE AND METHOD OF OPERATING THE SAME

CROSS-REFERENCE TO RELATED APPLICATION

This application claims priority from Korean Patent Application No. 10-2012-0093161, filed on Aug. 24, 2012, the contents of which are incorporated herein by reference in its entirety.

BACKGROUND

1. Technical Field

The present invention generally relates to a semiconductor memory device and method of operating the same, more particularly relates to a semiconductor memory device for performing a soft program operation after an erase operation is performed and method of operating the same.

2. Related Art

A semiconductor memory device is a memory device for enabling to store and read data. The semiconductor memory device is divided into a random access memory RAM and a read only memory ROM. Data stored in the RAM becomes lost if power is not supplied. This memory is referred to as a volatile memory. However, data stored in ROM is not lost though the power is not supplied. This memory is referred to as non-volatile memory.

A memory cell is programmed though an FN tunneling method when a program operation of the semiconductor memory device is performed. In case that high voltage is applied to a control gate of the memory cell in the program operation, electrons are charged in a floating gate of the memory cell. In a read operation of the semiconductor memory device, threshold voltage of the memory cell varied according to amount of the electrons charged in the floating gate is detected, and read data is determined according to level of the detected threshold voltage.

An erase operation of the semiconductor memory cell may be performed in the unit of selected block. For example, the erase operation may be performed by applying a ground voltage, e.g. 0V to every word line included in the selected block and providing an erase voltage, e.g. 20V to a well of the block.

Since threshold voltage distribution of memory cells of which an erase operation is finished is generally wide, a time taken for the program operation performed after the erase operation may increase. For example, in case that a memory cell having lowest threshold voltage and a memory cell having greatest threshold voltage of the erased memory cells are programmed simultaneously, velocity difference of the program operation between two memory cells occurs.

To improve the velocity difference, a soft program operation is performed after the erase operation is finished.

FIG. 1 is a view illustrating circuit diagram of a string in a memory cell array of a semiconductor memory device.

FIG. 2 is a view illustrating a graph showing threshold voltage (i.e., Vt) distribution according to a conventional soft program operation (i.e., No).

In FIG. 1 and FIG. 2, in the soft program operation, a ground voltage is applied to bit lines BL, and a supply voltage is provided to a drain select line DSL and a ground voltage is applied to a source select line SSL under the condition that a source line SL may be connected to the supply voltage. Every memory cell MC0 to MCn are soft-programmed simultaneously by applying simultaneously a soft program voltage to word lines WL<0:n> so as to have one or more memory cells having threshold voltages higher than a soft program verification voltage SEV. That is, the soft program operation is performed by using a program operation through the FN tunneling method similar to common program operation method (i.e., FN PGM). However, in case that every memory cell is simultaneously programmed through FN tunneling method, threshold voltage of every memory cell increases, and so effect of reducing width of the threshold voltage distribution is inadequate. In other words, the threshold voltage distribution B of the memory cells for which the soft program operation is finished increases comparing to threshold voltage distribution A (where the target threshold voltage is indicated by HEV) of the memory cells before the soft program operation is not performed, but the width of the threshold voltage distribution does not reduce.

SUMMARY

Various embodiments are provided for a semiconductor memory device for improving threshold voltage distribution of memory cells after an erase operation of the semiconductor memory device is performed and a method of operating the same.

A semiconductor memory device according to an embodiment includes a memory cell array configured to include memory cells; a peripheral circuit configured to perform an erase operation and a soft program operation; and a control circuit configured to control the peripheral circuit so that the memory cells are programmed though a hot carrier injection HCI method when the soft program operation is performed.

A method of operating a semiconductor memory device according to an embodiment includes increasing threshold voltage of memory cells corresponding to erase state by performing a soft program operation after an erase operation is finished, the soft program operation using a hot carrier injection HCI method; verifying through a soft program verifying operation whether or not the threshold voltage of the memory cells is higher than a target threshold voltage; and performing again the soft program operation and following step in case that it is determined that the threshold voltage of the memory cells is smaller than the target threshold voltage according to the soft program verifying operation.

A method of operating a semiconductor memory device according to an embodiment includes erasing memory cells by applying an erase voltage to a semiconductor substrate on which a memory cell array including the memory cells is formed; performing an erase verifying operation about the memory cells; and performing a soft program operation through a hot carrier injection HCI method in case that it is determined that threshold voltage of the memory cells is smaller than a target threshold voltage according to the erase verifying operation.

A method of operating a semiconductor memory device according to an embodiment includes applying a control voltage to a memory cell adjacent to a memory cell selected as a cell to be programmed in the direction of a drain select transistor, thereby turning off the adjacent memory cell; boosting a channel by providing a pass voltage to memory cells not selected except the adjacent memory cell and the selected memory cell; and injecting hot carrier in a semiconductor substrate on which the adjacent memory cell is formed to a electric charge storage layer of the selected memory cell according to electric field due to the pass voltage provided to the selected memory cell, thereby programming the selected memory cell.

In an embodiment, threshold voltage distribution of memory cells after an erase operation of the semiconductor memory device may be performed may be improved.

BRIEF DESCRIPTION OF THE DRAWINGS

The above and other features and advantages of the embodiments will become readily apparent by reference to the following detailed description when considered in conjunction with the accompanying drawings wherein.

DETAILED DESCRIPTION

Hereinafter, the various embodiments will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
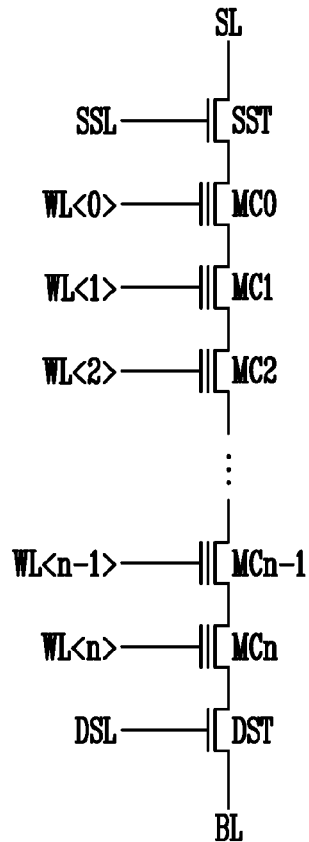
FIG. 1 is a view illustrating circuit diagram of a string in a memory cell array of a semiconductor memory device.
Figure 2:
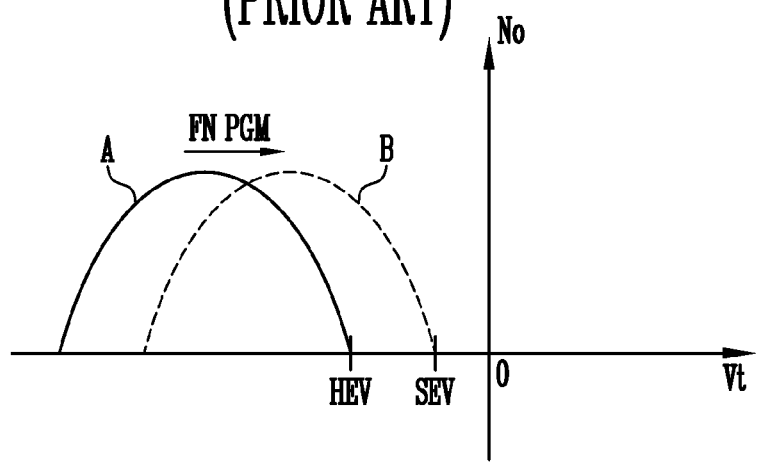
FIG. 2 is a view illustrating a graph showing threshold voltage distribution according to a conventional soft program operation.
Figure 3:
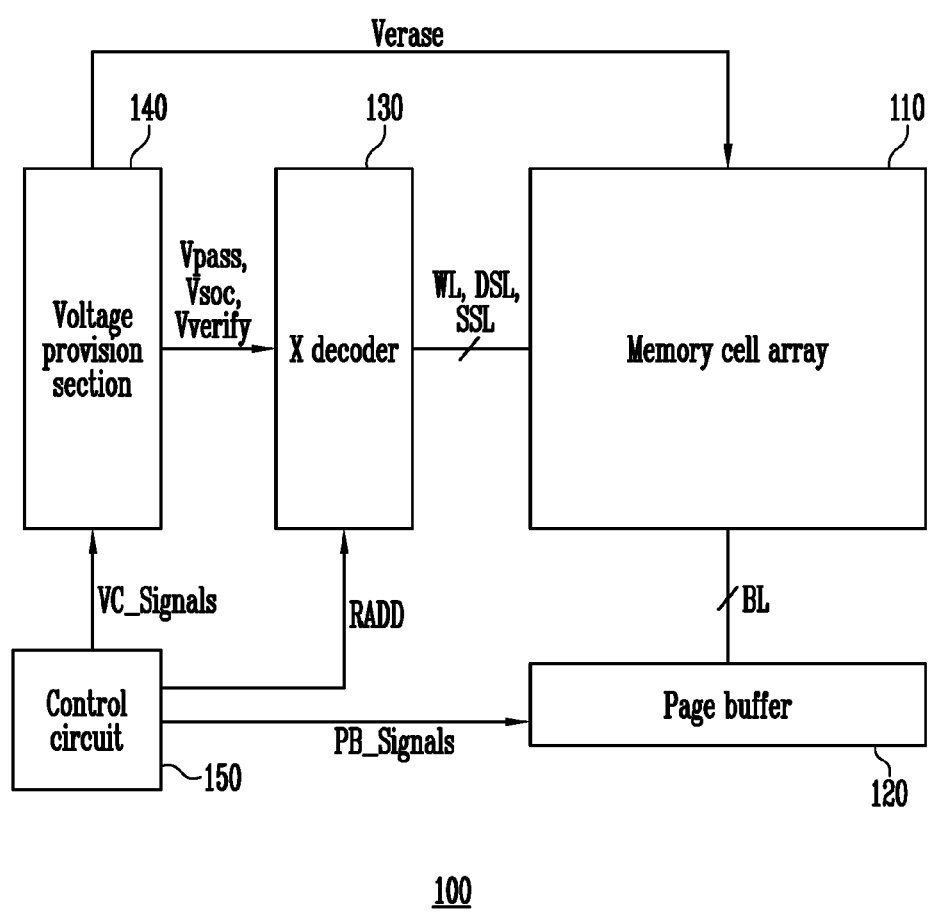
FIG. 3 is a block diagram illustrating a semiconductor memory device according to an embodiment.

FIG. 3 is a block diagram illustrating a semiconductor memory device according to an embodiment.

In FIG. 3, the semiconductor memory device 100 may include a memory cell array 110, a page buffer 120, an X decoder 130, a voltage provision section 140 and a control circuit 150.

The memory cell array 110 may include memory cells. Detailed constitution of the memory cell array will be described below.

The page buffer 120 may be connected to bit lines BL of the memory cell array 110. The page buffer 120 senses the potentials of the bit lines BL in response to page buffer control signals PB_signals outputted from the control circuit 150 when an erase verifying operation and a soft program verifying operation are performed, thereby verifying erase state of memory cells.

The X decoder 130 may apply operation voltages generated from the voltage provision section 140 to word lines WL, a drain select line DSL and a source select line SSL according to a row address RADD outputted from the control circuit 150.

The voltage provision section 140 may generate an erase voltage Verase applied to a p-well of a semiconductor substrate on which the memory cell array 110 is formed in response to voltage provision section control signals VC_signals outputted from the control circuit 150, and may generate a verifying voltage Vverify for the erase verifying operation and the soft program verifying operation. Additionally, the voltage provision section 140 may generate operation voltages including a control voltage Vsoc and a pass voltage Vpass so that memory cells of the memory cell array 110 are programmed through hot carrier injection in the soft program operation. The operation voltages for the soft program operation will be described below.

The control circuit 150 may output the control signals VC_signals so that the voltage provision section 140 may generate the erase voltage Verase in the erase operation, output the control signals VC_signals so that the voltage provision section 140 may generate the control voltage Vsoc and the pass voltage Vpass in the soft program operation, and may output the control signals VC_signals so that the voltage provision section 140 generates the verifying voltage Vverify in the erase verifying operation and the soft program verifying operation.

Additionally, the control circuit 150 may output the page buffer control signals PB_signals so that the page buffer 120 detects the pass/fail of the erase verifying operation and the soft program verifying operation by sensing potential of the bit lines BL in the erase verifying operation and the soft program verifying operation.

Furthermore, the control circuit 150 may set target threshold voltages of selected memory cells in the memory cell array 110 to have the same value when the erase verifying operation and the soft program verifying operation may be performed.

Figure 4:
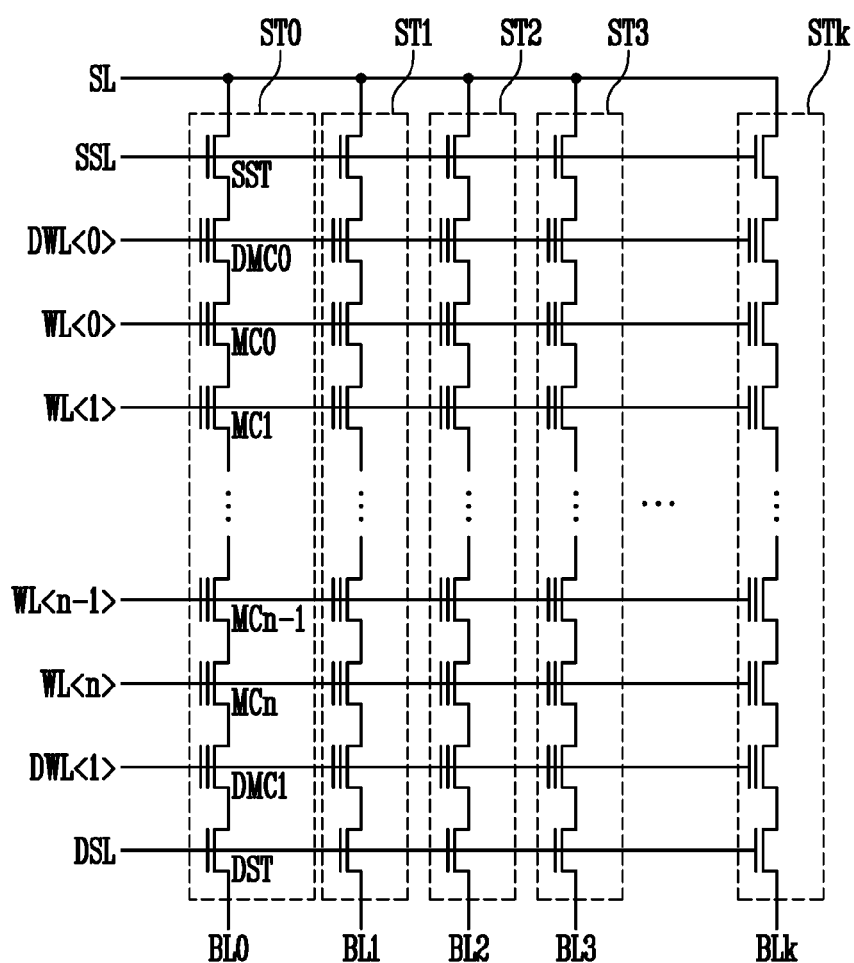
FIG. 4 is a view illustrating circuit diagram of a memory cell array in FIG. 3.

FIG. 4 is a view illustrating the circuit diagram of a memory cell array in FIG. 3.

In FIG. 4, the memory cell array 110 may include strings ST0 to STk. Since the strings ST0 to STk have a similar structure, their operation will be described through one string ST0 as a representative thereof.

The string ST0 may include a source select transistor SST, a first dummy cell DMC0, memory cells MC0 to MCn, a second dummy cell DMC1 and a drain select transistor DST connected between a source line SL and a bit line BL0. The string ST0 may include a first dummy transistor and a second dummy transistor instead of the first dummy cell DMC0 and the second dummy cell DMC1, and may include two first dummy cells DMC0 and two second dummy cells DMC1.

The gate of the source select transistor SST and the gate of the drain select transistor DST may be connected to the source select line SSL and the drain select line DSL, respectively. Gates of the first and the second dummy cells DMC0 and DMC1 may be connected to a first dummy line DWL<0> and a second dummy line DWL<1>, and word lines WL<n:0> may be connected to the memory cells MC0 to MCn.

Memory cells connected to the same word line may be defined as one page. That is, the memory cell array 110 may include pages.

Figure 5:
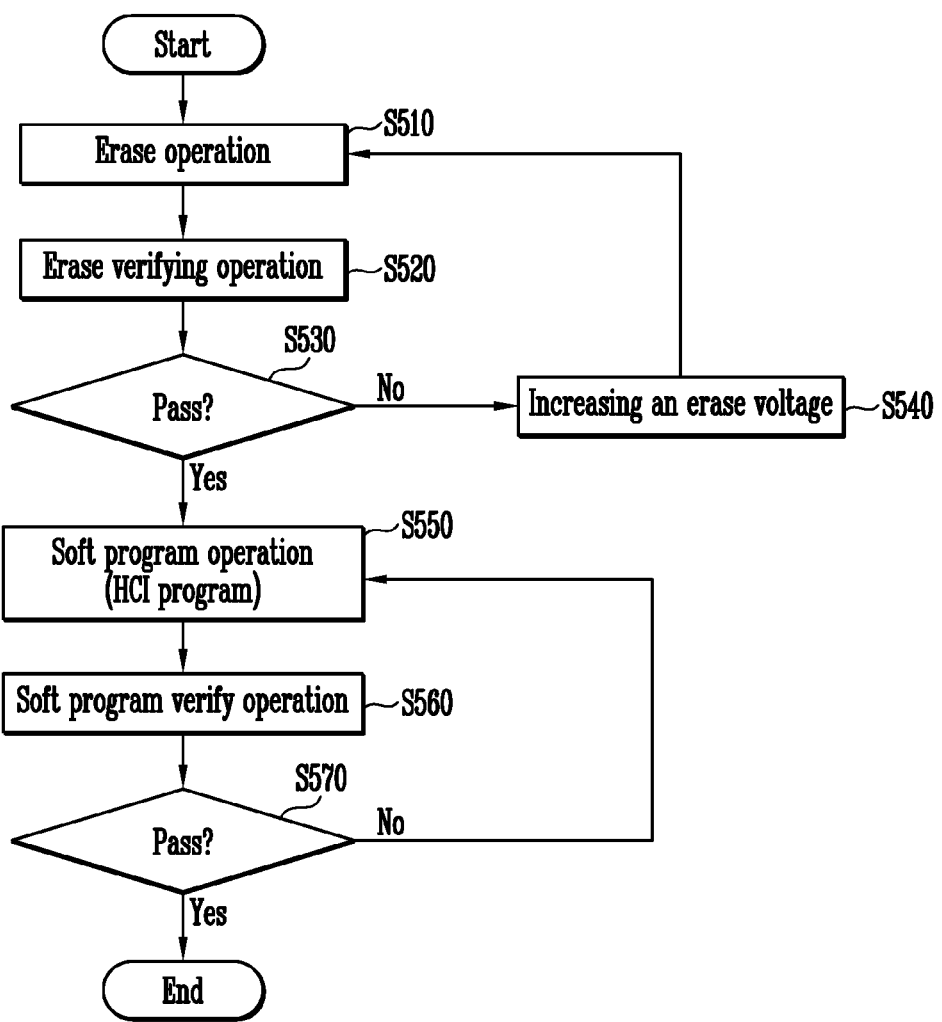
FIG. 5 is a flow chart illustrating a method of operating a semiconductor memory device according to an embodiment.

FIG. 5 is a flow chart illustrating a method of operating a semiconductor memory device according to one example embodiment.

The method of operating the semiconductor memory device with reference to FIG. 3 to FIG. 5 is as follows.

1) Erase Operation in Step S510

The voltage provision section 140 may generate the erase voltage Verase in response to voltage provision section control signals outputted from the control circuit 150. The generated erase voltage Verase may be applied to a p-well of a semiconductor substrate on which the memory cell array 110 is formed. Here, 0V may be applied to word lines of the memory cell array 110.

As a result, electric charges stored in floating gates of memory cells programmed in the memory cell array 110 are discharged to the semiconductor substrate through a tunnel dielectric layer, and so the threshold voltage of the memory cells become low.

2) Erase Verifying Operation in Step S520

After the step S510 is finished, it may be verified whether or not the memory cells in the memory cell array 110 are lower than a target threshold voltage HEV by using the page buffer 120 connected to the bit lines BL of the memory cell array 110. Here, it may be desirable to verify the erase verifying operation by sensing the threshold voltage of the memory cells using a virtual negative read VNR method. Particularly, voltages applied to the bit line and the p-well increase by a core voltage, e.g. 1V when the threshold voltage of the memory cells are sensed, and then the increased voltages are provided. As a result, though the threshold voltage of the memory cell is negative voltage, e.g. −1V, a voltage increased by the core voltage Vcore may be sensed as the threshold voltage.

3) Determination of the Erase Verifying Operation in Step S530

It may be determined that the erase verifying operation is passed (i.e., yes) if the threshold voltage of every memory cell is lower than the target threshold voltage HEV according to the step S520, and it may be determined that the erase verifying operation is failed (i.e., No) if the threshold voltage of one or more memory cell is higher than the target threshold voltage HEV.

4) Increasing the Erase Voltage in Step S540

In case that it is determined that the erase verifying operation is failed according to the step S530, the erase voltage Verase used in the step S510 may increase by a step voltage, the increased erase voltage Verase is set as new erase voltage Verase, and then the step S510 and following steps may again performed using the new erase voltage Verase. The voltage provision section 140 may increase the erase voltage Verase used in the step S510 by the step voltage in response to the voltage provision section control signals outputted from the control circuit 150, thereby generating a new erase voltage Verase.

5) Soft Program Operation (HCI Program) in Step S550

In case that it is determined that the erase verifying operation is passed according to the step S530, a soft program operation may be performed.

It may be desirable to perform the soft program operation using a HCI program method. The HCI program method may be as follows.

The voltage provision section 140 generates a pass voltage Vpass, e.g. approximately 7.5V, operation voltage, e.g. about 4.5V applied to the drain select line DSL and the source select line SSL, and the control voltage Vsoc, e.g. 0V or negative voltage in response to the voltage provision section control signals outputted from the control circuit 150.

The X decoder 130 may apply the control voltage Vsoc generated from the voltage provision section 140 to a word line WL<n> adjacent to a selected word line, e.g. WL<n−1> in a direction of the drain select transistor DST in response to the row address RADD to perform the soft program operation. The X decoder 130 may apply the pass voltage Vpass generated from the voltage provision section 140 to the other word lines WL<0> to WL<n−1>, DWL<1:0> in response to the row address RADD. As a result, a channel boosting phenomenon occurs to a channel of the semiconductor substrate on which the memory cells MC0 to MCn−1 and the dummy memory cells DMC0, DMC1, to which the pass voltage Vpass is applied, are formed. The memory cell MCn connected to the word line WL<n> adjacent in a direction of the drain select transistor DST may be turned off according to the control voltage Vsoc, and so a channel is not formed. Hot carrier in the semiconductor substrate, on which the memory cell MCn is formed, may be injected to the floating gate of the memory cell MCn−1 by electric field due to the pass voltage Vpass applied to the adjacent memory cell MCn−1. As a result, the memory cell MCn−1 is programmed, and thus threshold voltage of the memory cell MCn−1 increases.

Here, a ground voltage may be applied to the bit line BL and the source line SL.

The above HCI program method may be performed in the unit of memory cells connected to the word line of the memory cells MC0 to MCn in the memory cell array 110, i.e. the unit of the page.

6) Soft Program Verifying Operation in Step S560

The soft program verifying operation may be performed after the step S550 is finished. The soft program verifying operation may sense the threshold voltage of the programmed memory cells using the page buffer, and detect whether or not memory cell having threshold voltage higher than the target threshold voltage HEV of the programmed memory cells exists.

The soft program verifying operation may be desirable to sense and verify the threshold voltage of the memory cells using the virtual negative read VNR method.

7) Determination of the Soft Program Verifying Operation in Step S570

It may be determined that the soft program verifying operation is passed (i.e., Yes) if one or more programmed memory cell having the threshold voltage higher than the target threshold voltage HEV exists according to the step S560. Then, the page address may be changed, and the soft program operation in the step S550 and the soft program verifying operation in the step S560 are again performed about memory cells corresponding to the changed page address. In addition, in case that the step S550 and the step S560 are performed about every page, operation of the semiconductor memory device is finished.

It may be determined that the soft program operation of corresponding page is failed (i.e., No) if the threshold voltage of every memory cell is lower than the target threshold voltage HEV. In this case, the soft program operation in the step S550 may again be performed.

Here, cycling number by which the steps S550 and S560 are repetitively performed is counted. In case that the counted cycling number is more than preset number, it is determined that operation of the memory cell array 110 is failed, and so the corresponding block may be regarded as a bad block.

Every memory cell MC0 to MCn in the memory cell array 110 has the threshold voltage of below 0V, i.e. threshold voltage corresponding to erase state according to the soft program operation. That is, the soft program operation is not an operation of storing data, and it is performed for increasing the threshold voltage of the memory cells up to approximately 0V and reducing width of the threshold voltage distribution.

The semiconductor memory device, for which the soft program operation is finished, may perform a program operation for storing data, the program operation being performed by using the FN tunneling method.

Figure 6:
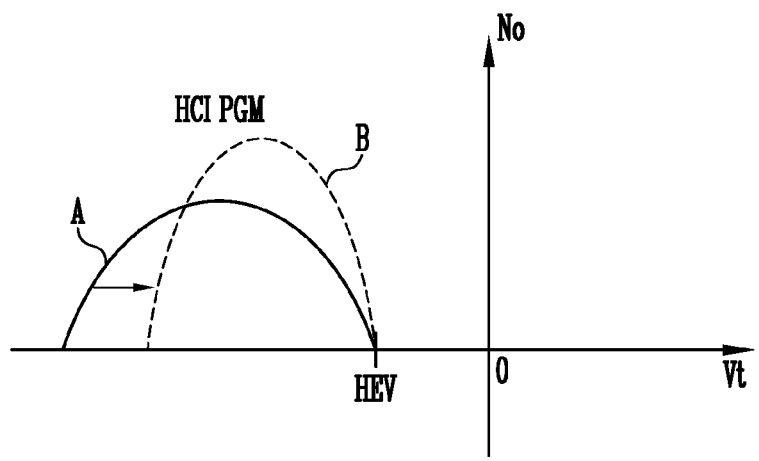
FIG. 6 is a view illustrating a graph showing change of threshold voltage distribution according to the soft program operation of the various embodiments.

FIG. 6 is a view illustrating a graph showing change of threshold voltage (i.e., Vt) distribution according to the soft program operation of the present invention (i.e., No).

As shown in FIG. 6, width of threshold voltage distribution B of the memory cells, about which the soft program operation is performed in the unit of the page of the memory cell array 110 using the HCI program method (i.e., HCI PGM), becomes smaller than that of the threshold voltage distribution A (where the target threshold voltage is indicated by HEV) of the memory cells after the erase operation is performed.

Various embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device, the method comprising:
    increasing threshold voltage of memory cells corresponding to erase state by performing a soft program operation after an erase operation is finished, wherein the soft program operation is performed using a hot carrier injection HCI method by turning off a memory cell adjacent to a selected memory cell among the memory cells and boosting a channel of a string including the selected memory cell;
    verifying through a soft program verifying operation whether or not the threshold voltage of the memory cells is higher than a target threshold voltage; and
    performing again the soft program operation and following step in case that it is determined that the threshold voltage of the memory cells is smaller than the target threshold voltage according to the soft program verifying operation.

2. The method of claim 1, wherein the soft program operation using the HCI method includes:
    applying a control voltage to the memory cell adjacent to the selected memory cell to be programmed of the memory cells, thereby turning off the memory cell adjacent to the selected memory cell;
    boosting a channel by providing a pass voltage to memory cells not selected except the memory cell adjacent to the selected memory cell and the selected memory cell; and
    injecting a hot carrier in a semiconductor substrate on which the memory cell adjacent to the selected memory cell is formed into an electric charge storage layer of the selected memory cell according to electric field due to the pass voltage provided to the selected memory cell, thereby programming the selected memory cell.

3. The method of claim 2, wherein the memory cell adjacent to the selected memory cell is a memory cell adjacent to the selected memory cell in the direction of a drain select transistor.

4. The method of claim 1, wherein the soft program operation is performed in the unit of page.

5. The method of claim 1, wherein the target threshold voltage is lower than 0V.

6. A method of operating a semiconductor memory device, the method comprising:
    erasing memory cells by applying an erase voltage to a semiconductor substrate on which a memory cell array including the memory cells is formed;
    performing an erase verifying operation about the memory cells; and
    performing a soft program operation through a hot carrier injection HCI method in case that it is determined that threshold voltage of the memory cells is smaller than a target threshold voltage according to the erase verifying operation wherein the HCI method includes turning off a memory cell adjacent to a selected memory cell among the memory cells and boosting a channel of a string including the selected memory cell.

7. The method of claim 6, further comprising:
    increasing the erase voltage by a step voltage in case that it is determined that one or more memory cell having the threshold voltage higher than the target threshold voltage exists according to the erase verifying operation, and then performing again the step of erasing and following steps using the increased erase voltage.

8. The method of claim 6, wherein the soft program operation is performed in the unit of page.

9. The method of claim 7, further comprising:
    performing a soft program verifying operation about the memory cells after the soft program operation is performed.

10. The method of claim 9, wherein it is determined that the soft program operation is passed in case that the threshold voltage of one or more memory cell is higher than the target threshold voltage according to the soft program verifying operation, and it is determined that the soft program operation is failed in case that the threshold voltages of the memory cells are smaller than the target threshold voltage.

11. The method of claim 10, wherein the soft program operation and following step are performed again in case that it is determined that the soft program operation is failed.

12. The method of claim 10, wherein the memory cells about which the soft program operation is performed have threshold voltage distribution corresponding to erase state.

* * * * *